(12) United States Patent
Kendall

(10) Patent No.: US 12,140,640 B2
(45) Date of Patent: Nov. 12, 2024

(54) BATTERY SENSOR ARRANGEMENT AND METHOD OF BALANCING BATTERIES

(71) Applicant: CDO2 LIMITED, Mayfield (GB)

(72) Inventor: Gary Kendall, Rotherfield (GB)

(73) Assignee: CDO2 Limited, Mayfield (GB)

( * ) Notice: Subject to any disclaimer, the term of this patent is extended or adjusted under 35 U.S.C. 154(b) by 384 days.

(21) Appl. No.: 17/640,665

(22) PCT Filed: Sep. 4, 2020

(86) PCT No.: PCT/GB2020/052135
§ 371 (c)(1),
(2) Date: Mar. 4, 2022

(87) PCT Pub. No.: WO2021/044169
PCT Pub. Date: Mar. 11, 2021

(65) Prior Publication Data
US 2022/0334192 A1    Oct. 20, 2022

(30) Foreign Application Priority Data

Sep. 4, 2019   (GB) ..................................... 1912736

(51) Int. Cl.
*G01R 31/396*    (2019.01)
*G01R 31/382*    (2019.01)
(Continued)

(52) U.S. Cl.
CPC ......... *G01R 31/396* (2019.01); *G01R 31/382* (2019.01); *G01R 33/02* (2013.01);
(Continued)

(58) Field of Classification Search
None
See application file for complete search history.

(56) References Cited

U.S. PATENT DOCUMENTS 6,307,378 B1   10/2001  Kozlowski
6,798,112 B1    9/2004  Daley
(Continued)

FOREIGN PATENT DOCUMENTS

CN    109742821 A    5/2019
DE    102005024075 A1   11/2006
(Continued)

OTHER PUBLICATIONS

Notification of Transmittal (Form PCT/ISA/220), International Search Report (Form PCT/ISA/210), and Written Opinion (Form PCT/ISA/237) for International Application No. PCT/GB2020/052135 mailed Dec. 14, 2020, 17 pages.

(Continued)

*Primary Examiner* — Lina Cordero
(74) *Attorney, Agent, or Firm* — Withrow + Terranova, PLLC; Vincent K. Gustafson

(57) ABSTRACT

A sensor arrangement for a network of busbar links of a battery module is provided, the sensor arrangement comprising: an array of sensors, each sensor having an output arranged to provide an indication of current in a respective busbar link of the network; a processor coupled to the outputs of the sensors and configured to: receive data from the sensor outputs; process the data to determine a current in each of a set of busbar links that are connected at a node of the network; and compare the currents in the busbar links of the set to determine an overall current at the node.

26 Claims, 19 Drawing Sheets

(51) Int. Cl.
  *G01R 33/02* (2006.01)
  *H01M 10/0525* (2010.01)
  *H01M 10/48* (2006.01)
  *H01M 50/507* (2021.01)
(52) U.S. Cl.
  CPC ....... *H01M 10/482* (2013.01); *H01M 50/507* (2021.01); *H01M 10/0525* (2013.01)

(56) References Cited

U.S. PATENT DOCUMENTS

| | | | |
|---|---|---|---|
| 7,112,793 | B2 | 9/2006 | Wright |
| 7,230,436 | B2 | 6/2007 | Terada et al. |
| 7,956,598 | B2 | 6/2011 | Ariyama |
| 8,952,655 | B2 | 2/2015 | Walley |
| 9,086,460 | B2 | 7/2015 | Rice et al. |
| 9,304,173 | B2 | 4/2016 | Fink |
| 9,329,213 | B2 | 5/2016 | Tsujimoto |
| 9,377,512 | B2 | 6/2016 | Frost et al. |
| 9,461,485 | B2 | 10/2016 | Koch |
| 9,511,670 | B2 | 12/2016 | Conell et al. |
| 9,513,317 | B2 | 12/2016 | Okuyama et al. |
| 9,535,130 | B2 | 1/2017 | Labbe et al. |
| 9,599,584 | B2 | 3/2017 | Yazami et al. |
| 9,620,823 | B2 | 4/2017 | Lohmann et al. |
| 9,647,471 | B2 | 5/2017 | Waterford |
| 9,677,184 | B2 | 6/2017 | Grant et al. |
| 9,695,520 | B2 | 7/2017 | Grant et al. |
| 9,748,612 | B2 | 8/2017 | Bergmann et al. |
| 9,766,293 | B2 | 9/2017 | Sims et al. |
| 9,865,902 | B2 | 1/2018 | Paganelli et al. |
| 9,880,206 | B2 | 1/2018 | Akimoto et al. |
| 10,018,657 | B2 | 7/2018 | Kaupp |
| 10,044,229 | B2 | 8/2018 | Partovi et al. |
| 10,074,879 | B2 | 9/2018 | Deane et al. |
| 10,096,988 | B2 | 10/2018 | Bailey |
| 10,209,277 | B2 | 2/2019 | Okuyama et al. |
| 2004/0140799 | A1 | 7/2004 | Romalis et al. |
| 2007/0090844 | A1 | 4/2007 | Klang |
| 2008/0186021 | A1 | 8/2008 | Hashio et al. |
| 2008/0303527 | A1 | 12/2008 | Fechalos et al. |
| 2012/0182021 | A1 | 7/2012 | McCoy et al. |
| 2013/0057288 | A1 | 3/2013 | Ogata et al. |
| 2013/0207663 | A1* | 8/2013 | Wiesner ............. H01M 10/441 324/426 |
| 2014/0184161 | A1 | 7/2014 | Deal et al. |
| 2015/0072195 | A1* | 3/2015 | Soleski ............... H01M 50/291 429/90 |
| 2015/0072209 | A1* | 3/2015 | Tyler ................... H01M 10/482 429/159 |
| 2015/0160298 | A1 | 6/2015 | Tabatowski-Bush |
| 2015/0211136 | A1* | 7/2015 | Boon ..................... C25B 15/02 204/229.8 |
| 2015/0233980 | A1 | 8/2015 | Umetsu et al. |
| 2016/0002801 | A1 | 1/2016 | Grant et al. |
| 2016/0084911 | A1 | 3/2016 | Mensah-Brown |
| 2016/0329615 | A1* | 11/2016 | Bergmann .......... H01M 50/103 |
| 2017/0153292 | A1 | 6/2017 | Steiber et al. |
| 2017/0207495 | A1 | 7/2017 | Shen |
| 2017/0261574 | A1 | 9/2017 | Stainsby et al. |
| 2018/0048166 | A1* | 2/2018 | Hsu .................... G01R 31/3835 |
| 2018/0083253 | A1 | 3/2018 | Dulle |
| 2018/0149678 | A1 | 5/2018 | Wolf et al. |
| 2018/0151862 | A1 | 5/2018 | Bessho et al. |
| 2018/0259598 | A1 | 9/2018 | Iriguchi |
| 2018/0261875 | A1 | 9/2018 | Imaji et al. |
| 2018/0331396 | A1 | 11/2018 | Soki et al. |
| 2019/0011511 | A1 | 1/2019 | Stainsby et al. |
| 2019/0115857 | A1 | 4/2019 | Sun et al. |

FOREIGN PATENT DOCUMENTS

| | | | |
|---|---|---|---|
| EP | 1586912 A1 | 10/2005 | |
| EP | 2541641 A1 | 1/2013 | |
| EP | 2682766 B1 | 1/2014 | |
| EP | 2543096 B1 | 2/2014 | |
| EP | 2818882 A1 | 12/2014 | |
| JP | 2004194410 A | 7/2004 | |
| JP | 2011133259 A | 7/2011 | |
| JP | 2015021923 A | 2/2015 | |
| KR | 101243473 B1 | 3/2013 | |
| KR | 20160026469 A | 3/2016 | |
| WO | 2014124038 A1 | 8/2014 | |
| WO | 2015185802 A1 | 12/2015 | |
| WO | WO-2019164974 A1 * | 8/2019 | ............ H01M 10/04 |

OTHER PUBLICATIONS

Search Report under Section 17(5) for United Kingdom Patent Application No. GB1912736.4 mailed Mar. 5, 2020, 4 pages.

* cited by examiner

A     B

A          B

BATTERY SENSOR ARRANGEMENT AND METHOD OF BALANCING BATTERIES

This application is a 35 U.S.C. § 371 national phase filing of International Application No. PCT/GB2020/052135, filed on Sep. 4, 2020, and claims the benefit of United Kingdom Patent Application No. 1912736.4, filed on Sep. 4, 2019, wherein the entire contents of the foregoing applications are hereby incorporated by reference herein.

FIELD

The present specification relates to a sensor arrangement for a busbar of a battery module. It also relates to a busbar provided with a sensor array and to a battery module or a battery pack having a busbar with a sensor array. It further relates to a method of balancing battery modules based on sensor data from such a sensor array.

BACKGROUND

The growth in the electrification of transport, including electric vehicles (EVs), has been driven in recent times by the development of lithium-ion batteries. However, to make the next-generation of vehicles cheaper and more efficient, there is a desire to be able to monitor, diagnose and respond to batteries using sensors in real-time.

One example of a sensor used to monitor batteries in real time is disclosed in U.S. Pat. No. 9,748,612, which relates to a battery pack having two battery cells with opposite orientations such that the two battery cells generate magnetic fields in opposing directions. This document discloses the use of a single sensor located inside of the battery pack, equidistant between the two battery cells, to measure a magnetic field and determine a difference in current flow between the two cells. This configuration is built into the battery pack and can determine the difference in current between two cells but not the individual current produced by any particular cell.

SUMMARY

According to one aspect, the present invention provides a sensor arrangement for a network of busbar links of a battery module, the sensor arrangement comprising: an array of sensors, each sensor having an output arranged to provide an indication of current in a respective busbar link of the network; a processor coupled to the outputs of the sensors and configured to: receive data from the sensor outputs; process the data to determine a current in each of a set of busbar links that are connected at a node of the network; and compare the currents in the busbar links of the set to determine an overall current at the node.

By node, it is meant that more than one busbar link in the network of busbar links are electrically connected by a node (i.e. a single point in the network) and by determining the current flowing in each of the busbar links connected to any one node, the total current at the node can be determined. In a battery module a node may correspond to the terminal of a cell, e.g. to provide a connection to that cell. The network of busbar links may have a corresponding number of nodes as the number of cells in a battery module.

The network of busbar links may define a rectangular grid of conductors, with nodes at junction points, and the sensor arrangement providing sensors that are positioned in a regular two dimensional array overlaying the network, wherein the sensors are positioned between the nodes, optionally around midway between the nodes.

The sensor arrangement of the present invention therefore provides a non-invasive way of determining current flows in a network of busbar links of a battery module. This in turn can be used to monitor current flow in the busbar, and in particular, in the cells of a battery module that the busbar is attached to. Furthermore, the sensor arrangement can be employed whilst a busbar network and battery module are in use, providing valuable data in real time.

As the present invention may be non-invasive, the sensor arrangement may be retrofit to an existing busbar and/or battery module in order to monitor the current flows within it. This avoids the need to redesign a busbar for this purpose.

By non-invasive it is meant that the sensor arrangement can be applied to a busbar and battery module without anything additional entering the busbar or battery module, e.g. the sensor arrangement can be fit to the exterior of an existing busbar arrangement.

Alternatively, the sensor arrangement may be fitted to a busbar arrangement during fabrication.

The sensor arrangement may be integrated into a busbar arrangement, for example during fabrication. In this way each sensor of the sensor arrangement may be provided in series with a respective busbar link of the busbar arrangement or each sensor of the sensor arrangement may be integrated into each of the busbar links.

It will be appreciated that the sensor arrangement may comprise any array of sensors capable of detecting current flow within the required accuracy for a particular application.

When current flows through a conductor (such as a busbar), an electromagnetic field is generated which can be detected by magnetic sensors and used to determine the current flow.

As such, some or all of the sensors may comprise a magnetic field sensor for sensing a magnetic field adjacent a busbar link when fitted to a busbar, the magnetic field being a result of current through the busbar link, and wherein the data from the sensor outputs comprises magnetic field data. Magnetic field measurements are a non-invasive way of measuring internal currents in the busbar links.

The array of sensors may comprise any of: fluxgates; printed fluxgates; and/or MEMS fluxgates, or a combination thereof. Such sensors are particularly advantageous as they are robust, relatively sensitive and significantly cheaper than many other commercially available sensors. These characteristics make such sensors particularly suited to the electric vehicle battery market, where cost and reliability are major concerns. This may improve the likelihood of the sensor arrangement being adopted into electrical vehicle designs, this improving the reliability of electric vehicle and consumer confidence, ultimately encouraging the uptake of such vehicles by the public.

Some or all of the magnetic field sensors may be optically pumped magnetometers. Optically-pumped magnetometers (OPMs) based on alkali vapours are some of the most sensitive devices available today, exceeding that of cryogenically cooled, superconducting devices and so provide the most accurate measurements. OPMs are also relatively small in size, between 3 and 5 $mm^2$, or 4 $mm^2$ or smaller.

When the sensor arrangement is fitted to a busbar, the magnetic field sensors may be in contact with a surface of the busbar links or within less than 10 mm of a surface of the busbar links. By placing the magnetic field sensors as close to the busbar links as possible (e.g. within 10 mm, 5 mm or even within 2 mm of the busbar), it is possible to identify small differences in magnetic field that would be difficult to identify otherwise, thus improving the accuracy of measurements.

It will be appreciated that the plurality of magnetic field sensors may be any magnetic sensors/magnetometers having the required sensitivity for a particular application. These may include, but are not limited to: fluxgates; OPMs; Hall probes; magneto-resistive sensors; and magneto-electric sensors.

The magnetic field sensors may measure both the magnitude and direction of the magnetic field. In this way, the data from the sensor outputs may be used to determine both a magnitude of current and a direction of the current flowing in the busbar links.

If the magnetic field sensors comprise fluxgates, the fluxgates may each comprise an upper conductive layer and a lower conductor layer, each of the conductive layers comprising conductive wire portions arranged on a surface of an insulative layer, each fluxgate further comprising a magnetic core sandwiched between the upper and lower conductive layers, and wherein ends of the conductive wire portions from the upper conductive layer are joined to ends of the conductive wire portions from the lower conductive layer to form coil structures, wherein the lower and/or upper conductive layer of each fluxgate device is preferably mounted to a substrate. Such an arrangement of fluxgates has been found to be robust, easy to manufacture and cost effective.

The magnetic field sensors may have a sensitivity better than 1 $\mu T$ $Hz^{-1/2}$, optionally better than 100 pT $Hz^{-1/2}$, optionally with a dynamic range of +/−500 $\mu T$ $Hz^{-1/2}$, optionally +/−10 mT $Hz^{-1/2}$.

Some or all of the magnetic field sensors may comprise a drive coil and a sense coil, outputs from each of the drive coils and the sense coils are arranged to send coil signal data from the drive coil and sense coil to inputs of multiplexers, and the multiplexers are arranged to send multiplexer signals to inputs of the processor. By multiplexing the magnetic sensors (e.g. fluxgates) cost and power requirements are reduced, allowing possible control and digital integration electronics to be shared across the sensors and placed at the edge of the array.

The array of sensors may be arranged on a substrate for attachment to a busbar. This can make the array easier to fit to a busbar, and more robust, particularly when the sensor arrangement comprises a printed fluxgate array.

The processor may be configured to process the data to determine a current in each busbar link of a plurality of sets of busbar links and compare the currents in the busbar links of each set to determine an overall current at a plurality of nodes. In this way, the current at a plurality of locations (e.g. nodes and busbar links) can be determined, thus giving a better overall picture of the currents flowing in a busbar/battery module.

The processor may be configured to assess a condition of each of a plurality of cells of a battery module based on the electrical current values at the nodes when the sensor is fitted to a busbar and battery module such that each of the plurality of cells is electrically connected to a respective node of the network. In this way, the current of individual cells in a battery module can be monitored.

The current flowing in each cell may be calculated by taking the summation of the current flow from each busbar link into the terminal of the cell. In this way, faulty cells (with either too much or too little current flowing) can be easily identified.

The condition of the cells being determined by the processor may be one or more of state of health (SoH), state of charge (SoC) and presence of one or more defects leaking charge internally between terminals of the cell, optionally wherein the defect comprises a soft short circuit.

There is a need for accurate and timely estimation of SoC, SoH and thermal properties of batteries, particularly in the transportation sector. This would lead to the effective elimination of the possibility of batteries overheating and causing fires. In addition this will increase the life-cycle of batteries, and reduce the cost of early retirement. Furthermore, the reliable prediction of temperature variability will decrease the cost of cooling systems.

The condition of the cells being determined may also comprise determining a temperature and/or predicted temperature change of the cell; and/or a determination of overheating of the cell.

The sensors may be held in a spaced relationship with respect to each other in the array and positioned so that each sensor aligns with a busbar link of a network of busbar links when the sensor arrangement is fitted to a busbar of a battery module. In this way, the sensor array can be designed for a particular busbar arrangement.

The processor may be configured to determine the amplitude and direction of current flowing through each of the busbar links, and may configured to determine an overall current at the node based on the amplitude and direction of the currents.

The array of sensors may measure both the magnitude and direction of the magnetic field. In this way, the data sent to the processor may include both a magnitude of current density and a direction of the current.

The array of sensors may measure only the magnitude of the magnetic field, known as total field or scalar magnetic sensors. In such cases the processor may be arranged to calculate the magnetic field gradient and thus infer the direction of the current.

The sensors may be less than 500 $mm^2$, optionally less than 200 $mm^2$, less than 100 $mm^2$ or less than 10 $mm^2$ (e.g. fluxgates). The size of each of the plurality of magnetic sensors may be less than 10 $mm^2$, preferably around 4 $mm^2$ (e.g. magneto-sensitive resistors). Smaller sensors can be arranged closer to the busbar links when the sensor arrangement is fitted and thus may provide more accurate measurements of current in the busbar link.

In addition, or as an alternative, to magnetic field sensors, the array of sensors may measure minute voltage drops in the busbar links and the processor may determine the current in busbars based on these measurements.

The magnetic field sensors may be on an outwardly facing surface of the busbar links with respect to the battery module as that is more convenient for fabrication, but they could also be mounted on an inwardly facing surface of the busbar links or a combination of inwardly and outwardly facing surfaces.

According to a second aspect, the present invention provides a busbar configuration for a battery module comprising: any of the above described sensor arrangements according to the first aspect; and a plurality of busbar links arranged in a network for connection to respective cells of a battery module at each of the nodes of the network, wherein each sensor of the sensor arrangement is provided adjacent to each of the busbar links, each sensor of the sensor arrangement is provided in series with each of the busbar links, and/or each sensor of the sensor arrangement is integrated into each of the busbar links.

There may be a plurality of sensors arranged adjacent to each busbar link. The sensors may be spaced (as measured from an outside edge of the sensor) less than 10 mm, preferably less than 5 mm and more preferably in contact with the busbar links. Arranging the sensors closer to the current flow in the busbar links can result in more accurate measurements, in particular with the use of magnetic field sensors.

The plurality of busbar links may comprise a plurality of switches, wherein each switch is associated with a busbar link to switch on/off a current flow through the busbar link. Such a switching arrangement introduces new capabilities to the busbar, described in more detail below. The switches may be bi-directional switches and these may be MOSFET switches. MOSFET switches are advantageous as they can provide a low resistance, high power switch.

Each busbar link may comprise such a switch. Alternatively, or in addition, a single switch could be present at the node which acts to switch on/off the current from the busbar(s) connected to that node.

The sensors of the sensor arrangement may be integrated into the busbar links. Thus, the term "busbar" used herein is not intended to be limited to conventional busbars such as simple metal connections. Instead, the term "busbar" is used to refer to any electrical connection between adjacent nodes.

Busbar arrangements with integrated sensors and/or switches may be simpler, more robust and more compact than a separate sensor arrangement.

Such busbar arrangements may comprise a PCB (printed circuit board) including busbar links and connections for the sensor arrangement and/or the switches. The PCB may comprise connection points at each of the nodes in order to connect to cells of a cell module. This connection may be made using conductive adhesive, conductive film or pressure connectors.

In this way the busbar arrangement can be used to replace a conventional busbar arrangement by fitting it to a cell module.

Alternatively, the cells of the battery module may be connected via integrated busbar links. Such connections between the cells and busbar links may be made with conductive adhesive, conductive film or pressure connectors. The integrated busbar links may comprise the sensors and switches described above. Alternatively, such sensors and/or switches may be connected to the cells via wires in free space.

The sensors of the sensor arrangement may be connected in series with the busbar links. The sensors may therefore be connected in between each node of the network. Each of the sensors may be connected in series with one of the switches described above. In this way, between each node there may be a busbar link, a sensor and a switch connected in series.

Some or all of the connections between the nodes of the network, the switches and/or the sensors of the sensor arrangement may be formed using conductive adhesive. Conductive adhesive is particularly advantageous as it can be applied at lower temperatures than conventional welding or soldering, thus preventing heat damage to components such as the sensors, busbars or cells. It will be appreciated than any of the other electrical connections described herein may also be made using conductive adhesive. It will also be appreciated that alternatives such as conductive film or pressure connectors could be used to form any of the electrical connections described herein.

Operation of the switches may be coordinated to isolate a cell within a battery module. For example, all of the switches connecting a faulty cell may be opened around each cell to allow the isolation of the cells.

Operation of the switches may be coordinated to connect groups of cells in series and/or parallel within a battery module. This provides the arrangement with the ability to reconfigure the individual cells in the module to balance the load within the module. This allows the cells within a single module to be configured in two or more series blocks to set the module voltage and load across the cells.

According to a third aspect, the present invention provides a battery module comprising: an array of cells, the cells being electrically connected by any of the above described busbar configurations according to the second aspect, wherein a network of busbar links extends between adjacent cells, wherein a sensor is mounted on each busbar link between adjacent cells, a sensor is provided in series with each of the busbar links and/or a sensor is integrated into each of the busbar links, and wherein the processor is configured to monitor electrical current flowing in each cell.

Each node of the network may be connected to a cell of the battery module. In this way, the current to and from each cell may be determined in the manner described above. Each node of the network may be connected to a cell of the battery module via a conductive adhesive, conductive film or pressure connectors.

The cells may be lithium-ion cells, and/or the battery module may be for an electric vehicle. The battery module may comprise an array of at least 4 by 4 cells, at least 8 by 4 cells or at least 12 by 8 cells. The battery module may comprise at least 4 cells, at least 8 cells or at least 48 cells.

It will be appreciated that the cells may be of any type suitable for a particular application. For example, but not limited to, any one of: Nickel Cadmium (NiCd) cells; Nickel-Metal Hydride (NiMH) cells; Nickel Iron (NeFe) cells; and lead acid cells. The cells may also be electrochemical cells and/or capacitors.

According to a fourth aspect, the present invention provides a battery pack comprising one or more of the battery modules described above in relation to the third aspect, wherein the battery modules are electrically coupled to form the battery pack and the battery pack comprises one or more battery management systems for controlling an output from a set of terminals of the battery pack.

The battery pack may comprise any of the above described busbar arrangements according to the second aspect including the plurality of busbar links comprising a plurality of switches, and the battery pack may be arranged to send data to the battery management system, wherein the battery management system controls the switches based on this data, and wherein the data comprises any one or a combination of: the data from the sensor outputs; the current in each of a set of busbar links that are connected at a node of the network; an overall current at each node; a condition of each of a plurality of cells; and/or an optimum voltage and/or current from the battery pack.

The battery pack may comprise at least four battery modules, at least 8 battery modules, or at least 16 battery modules and a battery management system may control each one or a set of battery modules.

The battery management system may comprise a processor that is used as the processor of the sensor arrangement of the first aspect. Alternatively, the processor of the sensor arrangement can send data (e.g. data regarding the condition of cells) to the battery management system.

The battery management system may control the switches to isolate cells based on the data; for example, if too much or too little current is coming from a particular cell.

The battery management system may control the switches to reconfigure the individual cells in the module to balance the load within the module. For example, based on an optimum voltage and/or current, the cells within a single module may be configured in two or more series blocks to set the module voltage and load across the cells. Cells may also be isolated for this reason.

An advantage of this is that a battery module can be reconfigured at the cell level to take account of use and voltage drop from the individual cells and return a voltage level that is high enough to meet a specific load need.

Alternatively, when the battery module is fully charged or close to full charge, the battery module may be reconfigured to provide a lower output voltage initially which meets the load requirements at that time to extend battery life.

The battery pack or battery management system may comprise a display and/or a human machine interface, and the system may be configured to display the currents on the display or human machine interface such that possible faults or dangerous cells can be visualised more easily. A human machine interface may also be used by an operator to control the system, for example by controlling the switching arrangement.

Any of the aspects described herein may also be separately employed to check the quality of cell and/or busbar connections in a battery pack in order to identify faults in the connections themselves. This has the potential to solve one of the largest problems in battery pack manufacture: non-invasively identifying a faulty weld (i.e. connection to a busbar) in a battery pack.

To achieve this, current/magnetic sensors such as the magnetometers or Hall sensors previously described may be placed between each cell to measure the current flow in the busbar link between neighbouring cells. This allows the current flow in individual cells to be determined as previously discussed; if reduced current flow is detected, bad welds can be identified.

As such, the present invention also extends to a method of identifying faults and/or bad connections in busbar links, a busbar arrangement, a cell, a battery module and/or a battery pack.

According to another aspect, the present invention therefore provides a method of assessing a condition of a weld and/or connection between cells of a battery module using one of the above described sensor arrangements, wherein neighbouring cells of the battery module are connected to one another via busbar links, the method comprising: processing data received from the sensor outputs to assess currents in the busbar links between neighbouring cells; comparing the currents flowing through individual cells, the nodes and/or the busbar links; and identifying a faulty weld and/or connection based on detecting a level of current that is indicative of a defect.

The method may comprise a step of applying the sensor arrangement to the battery module. Such a step may be part of a battery module manufacturing process or may be performed after manufacturing of the battery module is complete, e.g., when the battery module is one of a plurality of battery modules forming a battery pack.

As mentioned above in relation to one of the busbar configurations of the second aspect, operation of switches in the busbar configuration may be coordinated to isolate a cell within a battery module. For example, all of the switches connecting a faulty cell may be opened around each cell to allow the isolation of the cells.

As previously described, operation of the switches may be coordinated to connect groups of cells in series and/or parallel within a battery module. This provides the arrangement with the ability to reconfigure the individual cells in the module to balance the load within the module. This allows the cells within a single module to be configured in two or more series blocks to set the module voltage and load across the cells.

According to yet another aspect, the present invention therefore provides a method of optimising the output from or load on cells of a battery module, the battery module comprising a busbar configuration according to the second aspect (and including the switches), the method comprising: operating the switches of the busbar arrangement to isolate one or more cells, connect groups of cells in series and/or connect groups of cells in parallel within the battery module.

FIGURES

Certain example embodiments will now be described by way of example only and with reference to the accompanying drawings, in which.

DETAILED DESCRIPTION

Figure 1:
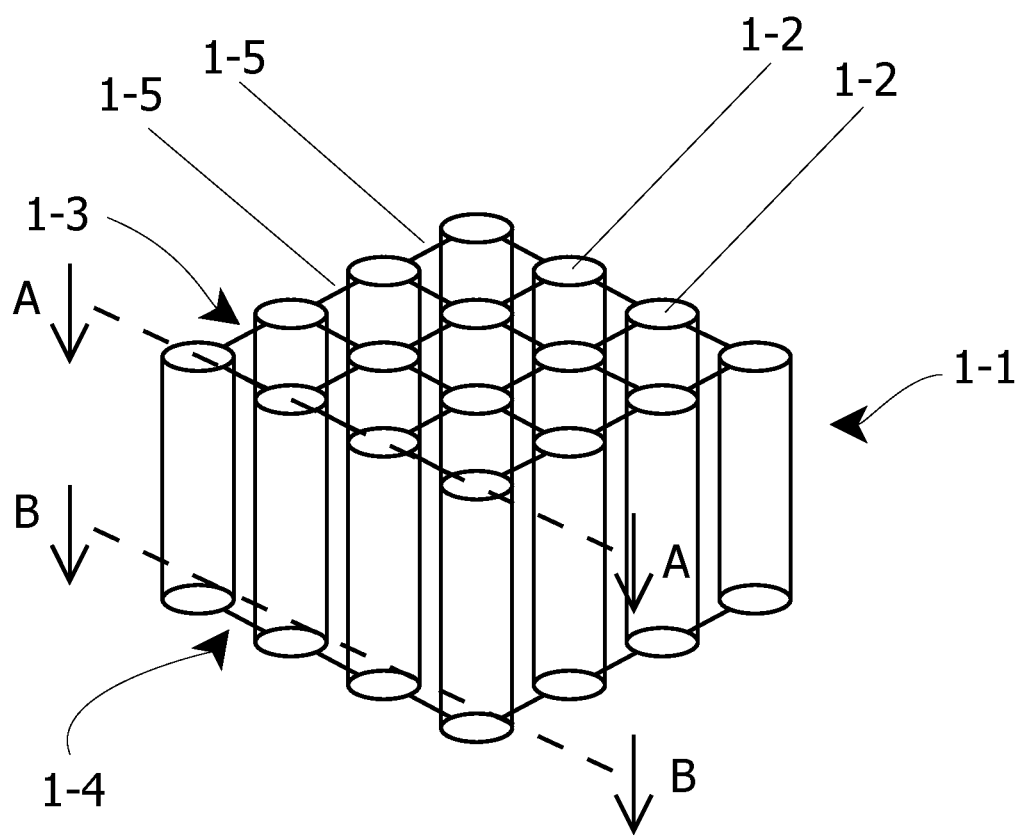
FIG. 1 shows a perspective view of a battery module.

FIG. 1 shows a prior art battery module (1-1) comprising sixteen cylindrical cells (1-2) in a 4×4 configuration arrangement. The cells are connected via a busbar at the top of the module (1-3) and also via a busbar (1-4) at the base of the module, the busbars comprising a series of busbar links (1-5) between adjacent cells. In the example, the cells are mounted so that the negative terminal of each cell is located at the top of the module, so that the cells are in a parallel arrangement. In an alternative arrangement, the negative terminal of each cell may be located at the base of the module.

Figure 2:
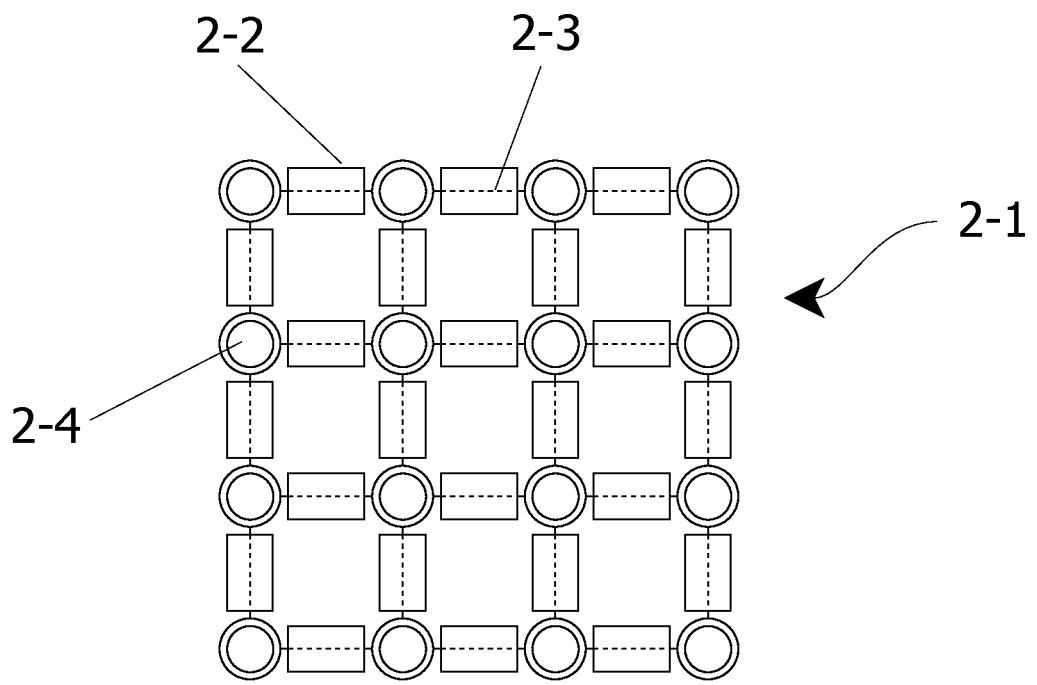
FIG. 2 shows a plan view of a battery module with a sensor arrangement.

FIG. 2 shows a plan view of a 4×4 battery module (2-1) similar to that described above. In this first embodiment, a magnetometer (2-2) is mounted on each busbar link (2-3) between adjacent cells (2-4), at the top of the module. The busbar links are represented by dashed lines beneath the magnetometers. Each magnetometer reading can be used to calculate (non-invasively) the current in the busbar link.

While the magnetometers (2-2) are shown mounted on an outwardly facing surface of the busbar links (2-3) with respect to the battery module (2-1) as that is more convenient for fabrication, they could also be mounted on an inwardly facing surface of the busbar links (2-3) or a combination of inwardly and outwardly facing surfaces.

The current flowing in each cell can be calculated by taking the summation of the current flow from each busbar link into the terminal of the cell. Using this method, faulty cells (with either too much or too little current flowing) can be easily identified.

In this embodiment it is possible to measure the current in each cell within the module and the module can be controlled as a single unit.

Figure 3:
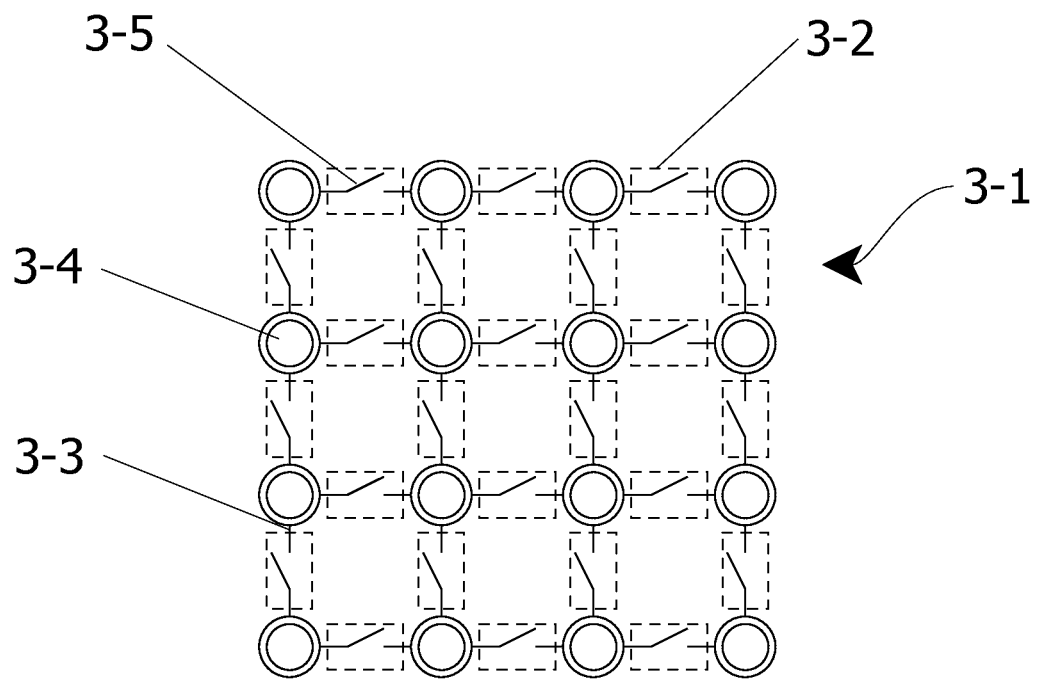
FIG. 3 shows a plan view of a battery module with a sensor arrangement and switches.

In a second embodiment, it is possible to isolate dangerous or faulty cells individually within the module. The second embodiment is shown in FIG. 3. A 4×4 module (3-1) is shown with magnetometers (3-2) mounted on the busbar links (3-3) between individual cells (3-4), at the top of the module. In addition, a switch (3-5) is mounted on each busbar link between cells. The magnetometers are illustrated with dashed lines for clarity. As in the first embodiment, the current flowing in each cell is calculated by taking the summation of the current flow from each busbar link into the terminal of the cell. The switches can be opened around each cell to allow the isolation of faulty cells.

Figure 4:
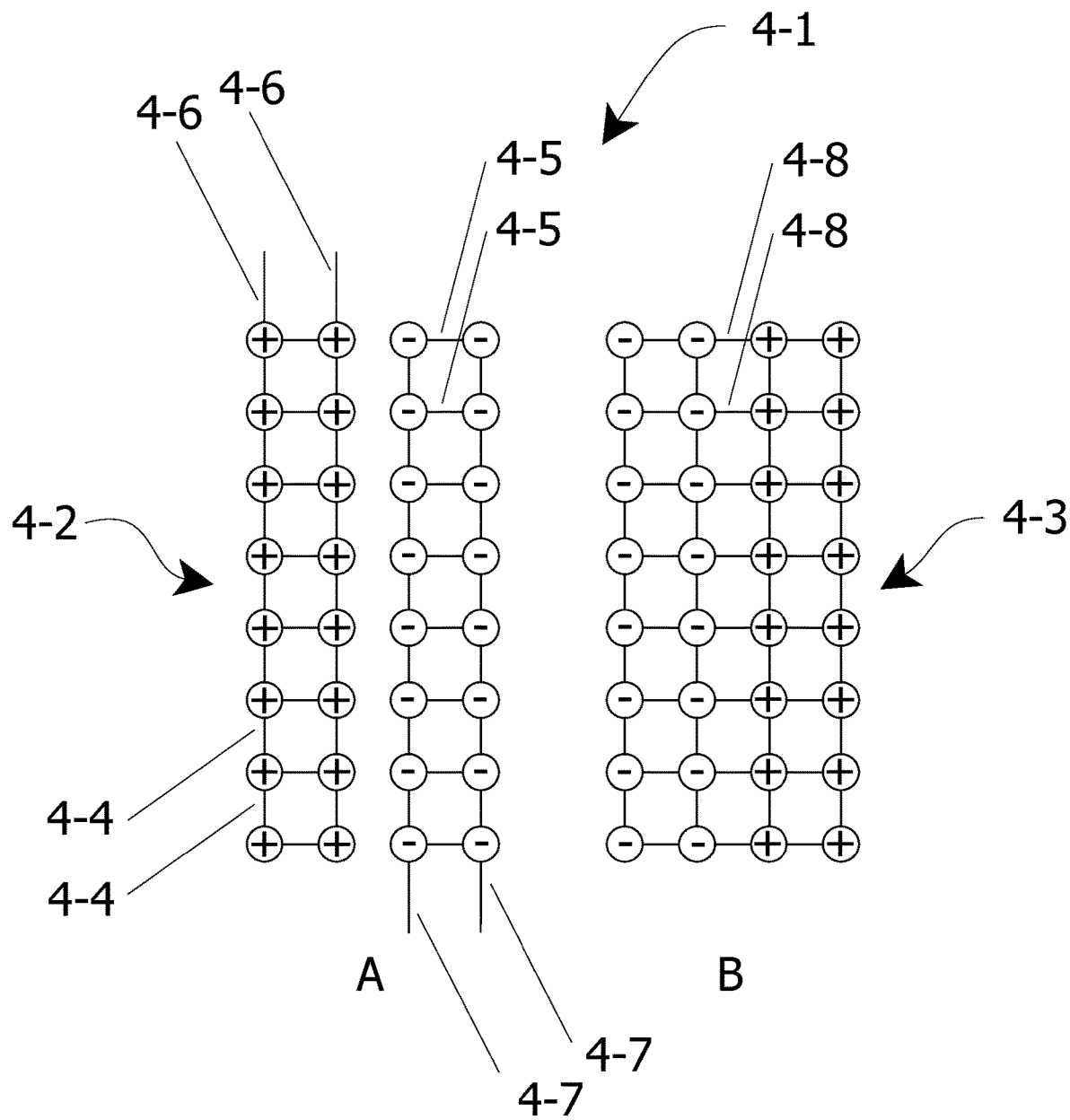
FIG. 4 shows a top plan view of the top of a battery module and a top plan view of the bottom of a battery module similar to that shown in FIG. 3.

A third embodiment uses the techniques previously described in the first two embodiments, with the additional feature of the ability to reconfigure the individual cells in the module to balance the load within the module. This allows the cells within a single module to be configured in two or more series blocks to set the module voltage and load across the cells. A first example of this embodiment is shown in FIG. 4. In this 4×8 module (4-1), cells are mounted so that the positive terminal of one section of cells and the negative terminals of another section of cells are in contact with the upper busbar. The 4×8 array on the left side of FIG. 4 (4-2) shows a view of the top of the module (as viewed from above, e.g. from the exemplary line A-A shown in FIG. 1). The 4×8 array on the right side of FIG. 4 (4-3) shows a view of the bottom of the module (also as viewed from above, e.g. from the exemplary line B-B shown in FIG. 1). The left array (4-2) shows 16 cells on the left with positive terminals in contact with the top busbar via busbar links (4-4) and 16 cells on the right with negative terminals in contact with the top busbar via busbar links (4-5).

Magnetometers (not shown) and switches are mounted on the busbar links between adjacent cells, at the top of the module (4-2) as well as on the busbar links at the bottom of the module (4-3). The switches can be used to configure the module, so that the cells are connected in parallel or in series. Where busbar links between cells are shown, switches are closed and if no connection is shown between adjacent cells, switches are open. Hence, at the bottom of the array (4-3), all switches are closed. At the top of the array (4-2), switches are open between the bank of 16 cells connected in parallel on the right (those with positive terminals at the top) and the bank of 16 cells connected in parallel on the left (those with negative terminals at the top). All other switches are closed. The external connectors (4-6, 4-7) to the module (4-1) are shown. Current flows through the module via the external connectors (4-6), through the positive terminals of the first group of cells connected in parallel at the top of the array (4-2), to the negative terminals of those cells at the bottom of the array (4-3). Current then passes through the closed switches (4-8) connected in series, then through the second group of cells which are connected in parallel, to the top of the array (4-2) to "exit" the module via external connectors (4-7).

By adjusting the switching arrangement as shown in the next two examples, the voltage of the module can be controlled. If the cells are connected in parallel, the voltage of the module will equal the voltage of the cells. However, if the cells are connected in series, the voltage of the module will be a multiple of the voltage of individual cells.

Figure 5:
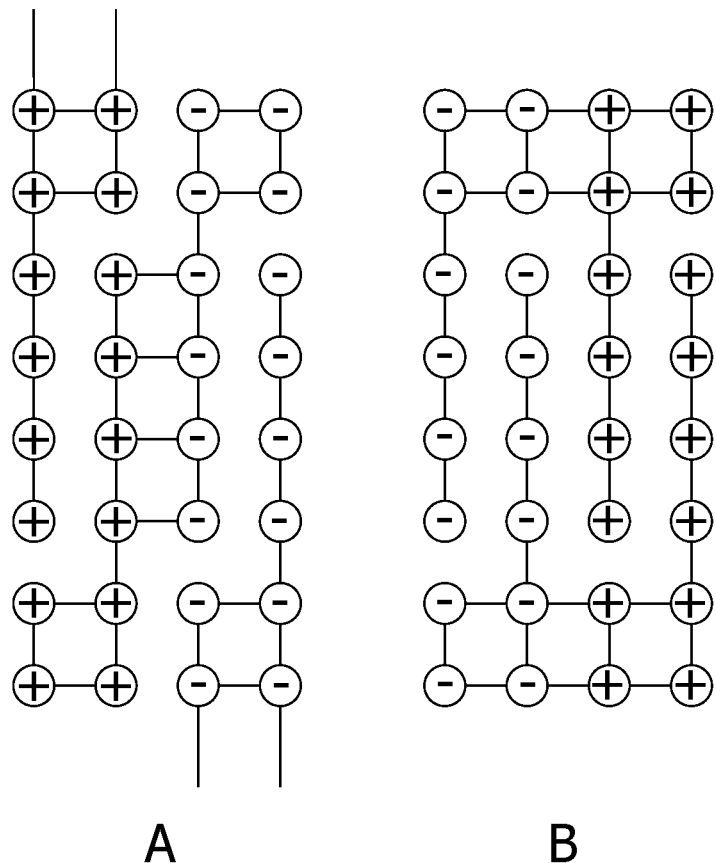
FIGS. 5 to 9 show one switching arrangement of battery module shown in FIG. 4.

A second example of the third embodiment is given in FIG. 5. The orientation of the cells is as before (shown in FIG. 4), however, in this example, the switching arrangement has been altered so that there are several groups of cells acting together in parallel at each stage. As before, closed switches are represented by a solid line connecting adjacent cells. If no connection between adjacent cells is shown, that switch is in the open position.

Figure 6:
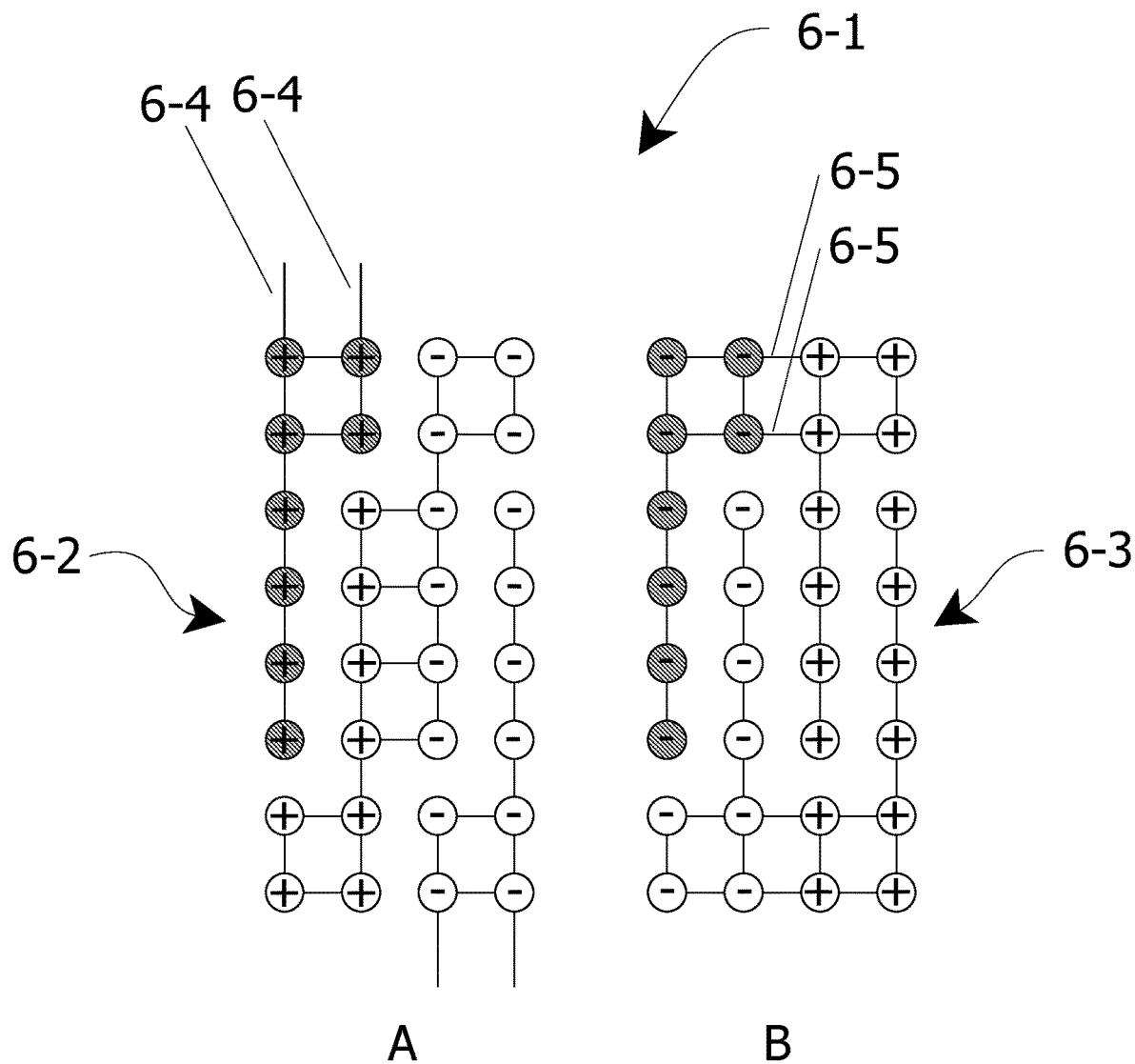

FIG. 6 shows the first stage. The module (6-1) is again split into two views: the top of the module, as viewed from above (6-2) and the bottom of the module, also as viewed from above (6-3). The top of the module (6-2) has as its "input" external connectors (6-4). Current flows through the first group of cells in parallel (shaded grey) and this passes in series to the second group of cells at the bottom of the module via two busbar links (6-5).

Figure 7:
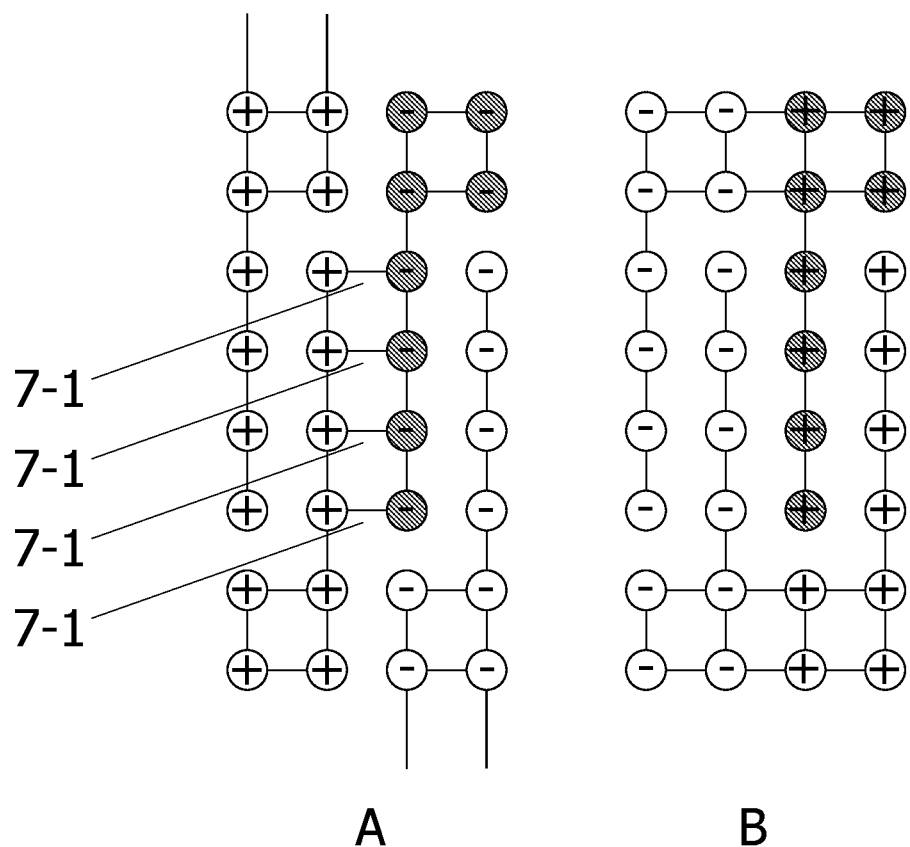
Figure 8:
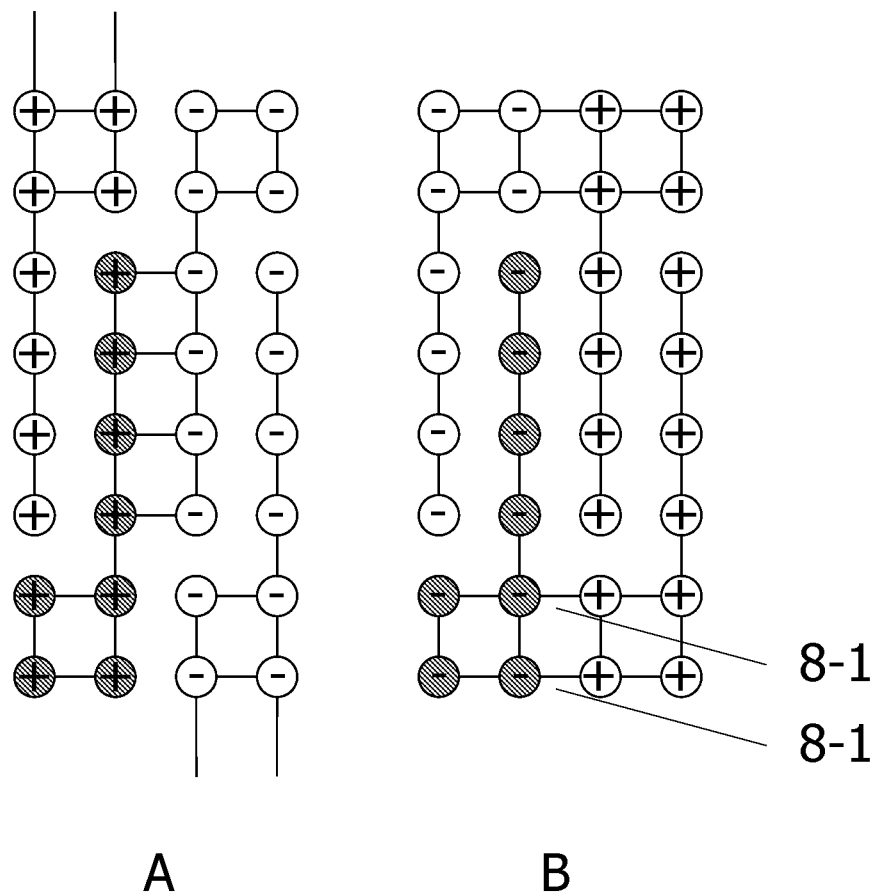
Figure 9:
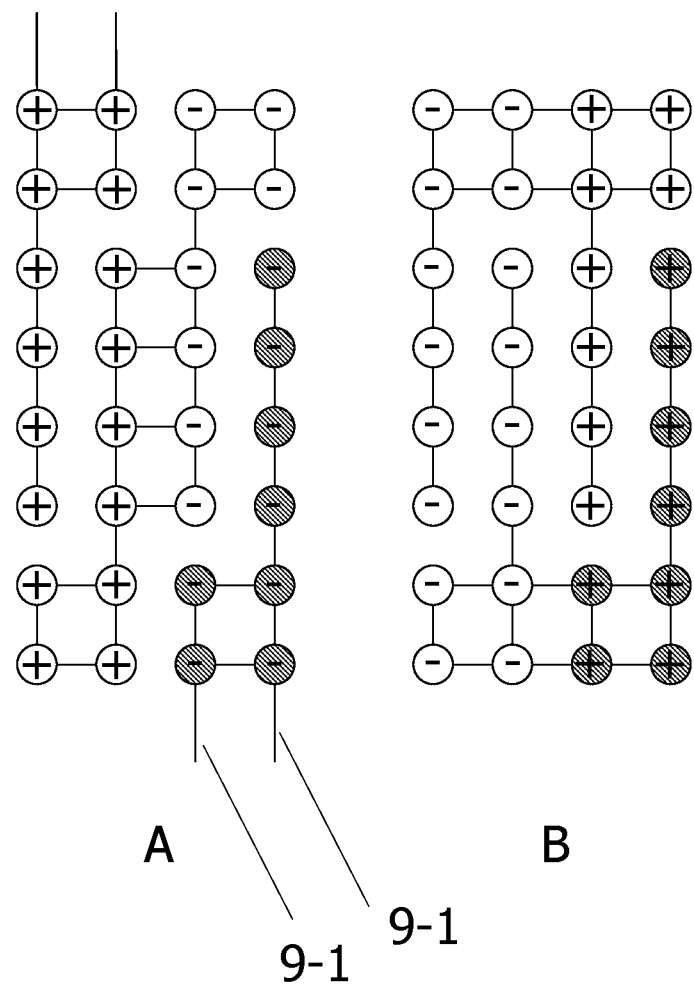

FIG. 7 shows the second group of cells in parallel (shaded grey), through which current flows via four busbar links (7-1) connected in series, to the third group of cells in parallel shown in FIG. 8. Current flows through the third group of cells (shaded grey) via two busbar links (8-1) connected in series, to the final group of cells in parallel. FIG. 9 shows the final group of cells (shaded grey) through which current flows out of the module via external connectors (9-1).

In this second example, 8 cells act together in each group at each stage i.e. there are evenly balanced cells across the module. In the third example, given below, of this (third) embodiment, there are unevenly balanced cells across the module.

Figure 10:
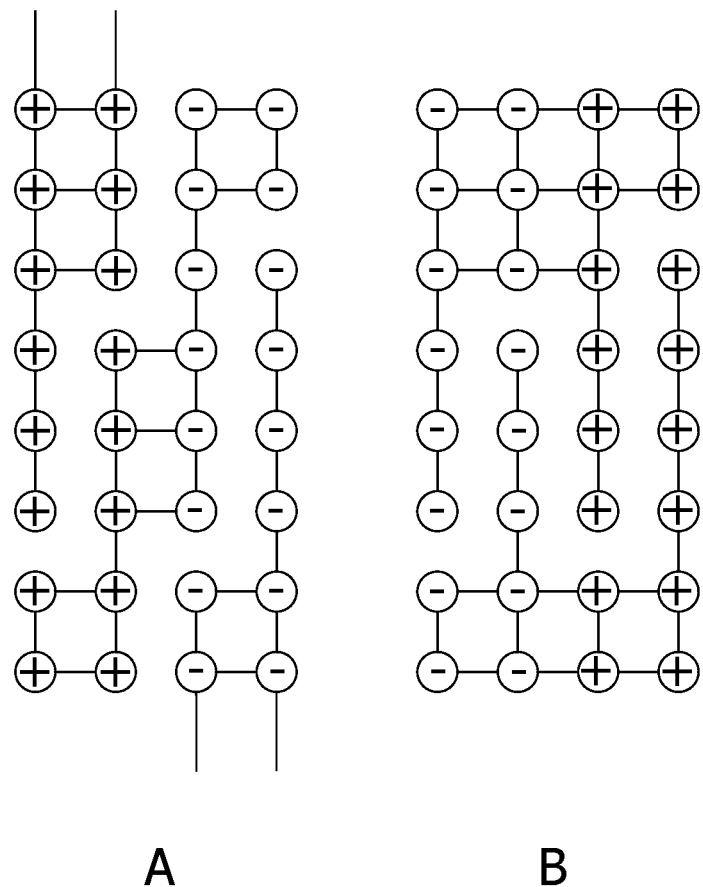
FIGS. 10 to 14 show another switching arrangement of the battery module shown in FIG. 4.

A third example of the third embodiment is given in FIG. 10. The orientation of the cells is the same as that shown in the previous examples (FIG. 4 and FIGS. 5-9), however, a different switching arrangement is shown. As in the previous example (FIGS. 5-9), groups of cells act together in parallel at each stage to direct the current flow within the module.

Figure 11:
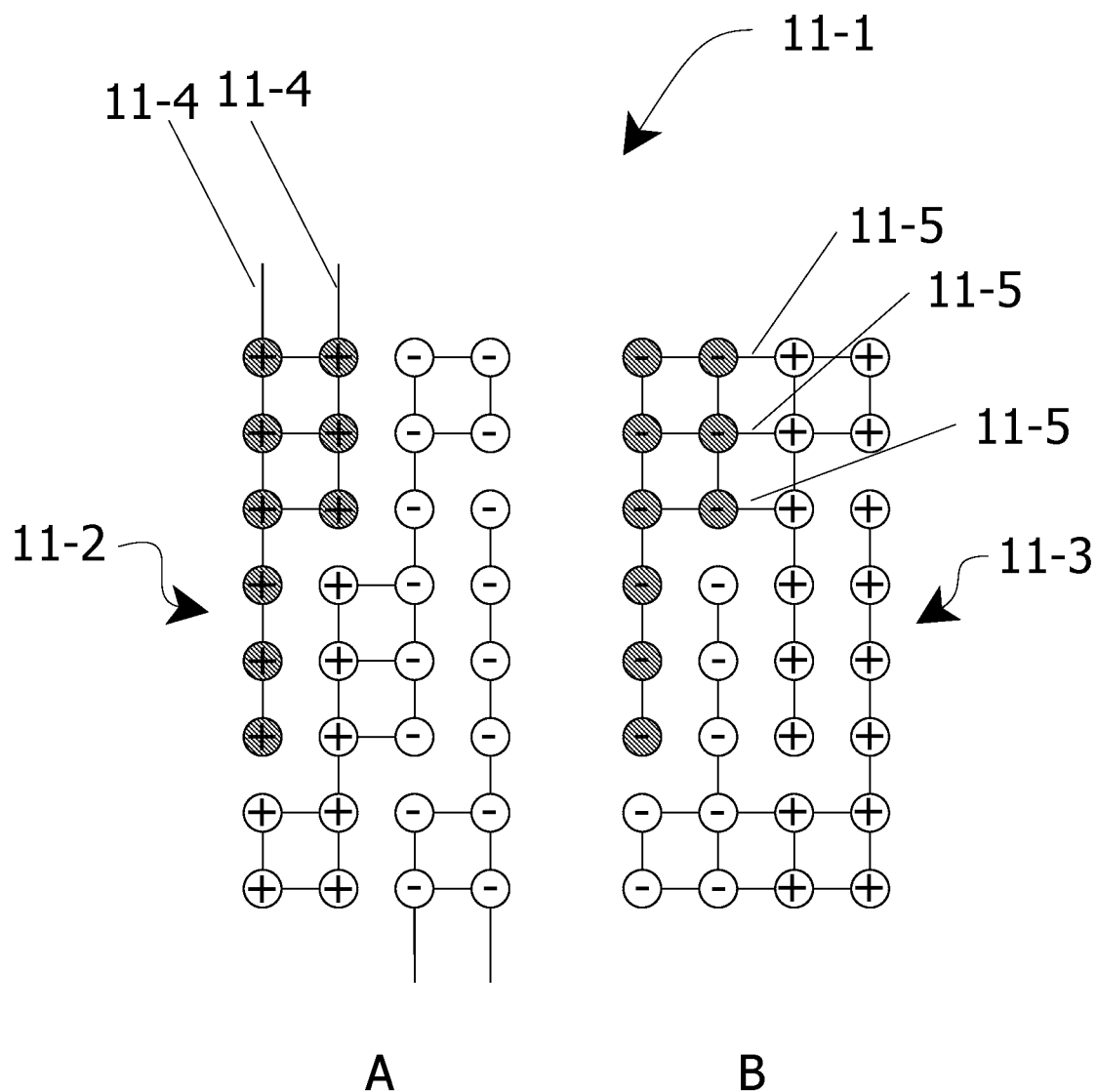

FIG. 11 shows the first stage. The module (11-1) is again split into two views: the top of the module, as viewed from above (11-2) and the bottom of the module, also as viewed from above (11-3). The top of the module (11-2) has as its "input" external connectors (11-4). Current flows through the first group of cells in parallel (shaded grey) and this passes in series to the second group of cells at the bottom of the module via three busbar links (11-5).

Figure 12:
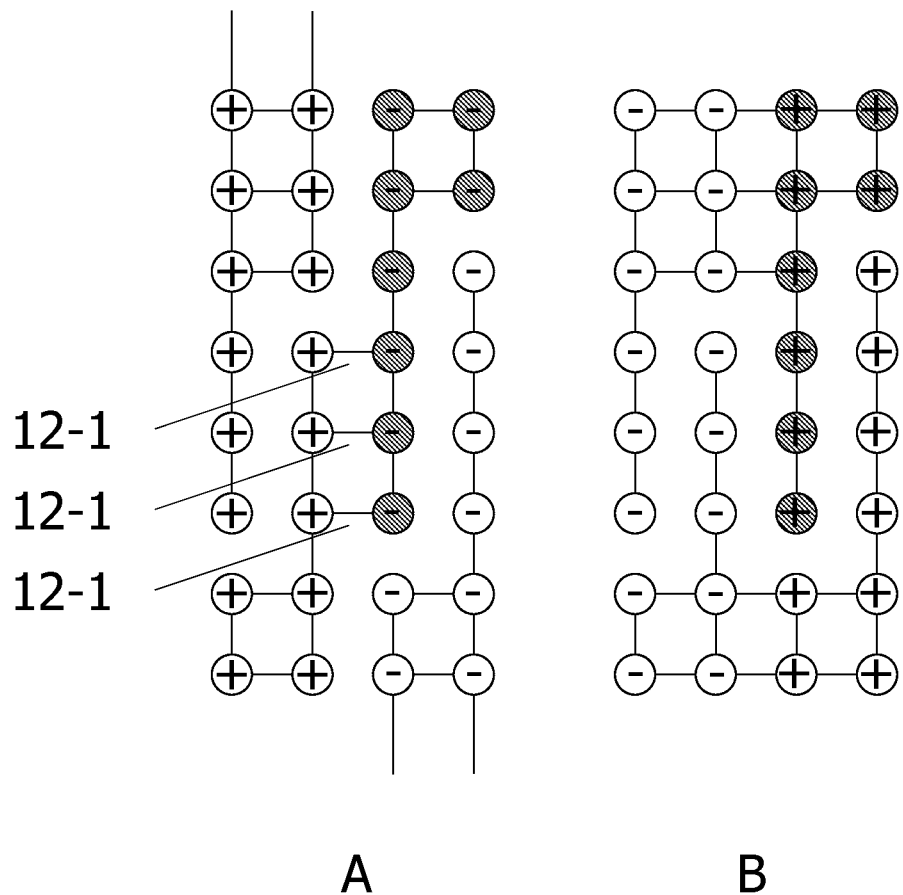
Figure 13:
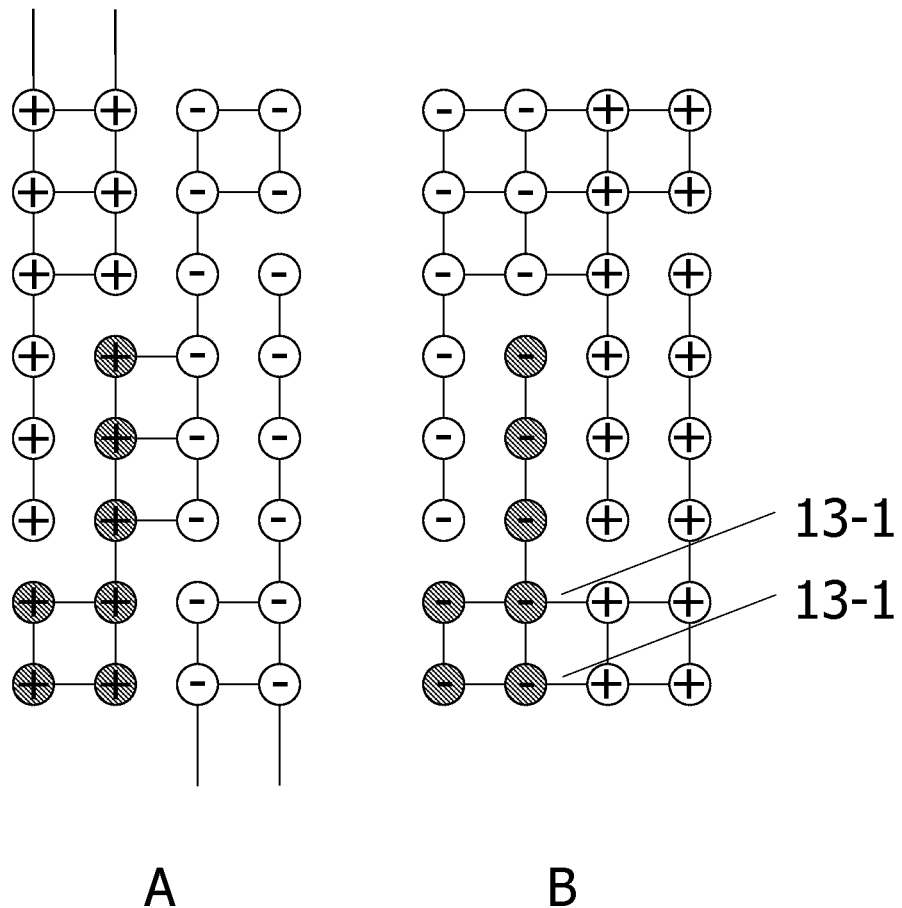
Figure 14:
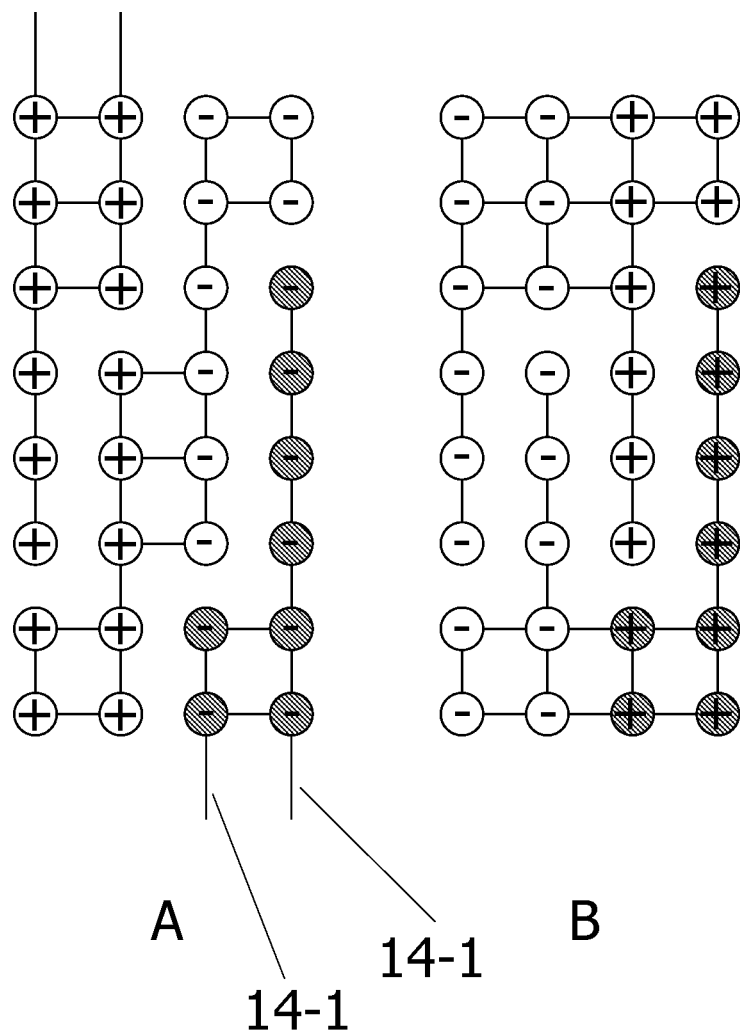

FIG. 12 shows the second group of cells in parallel (shaded grey) through which current flows via three busbar links (12-1) connected in series, to the third group of cells in parallel shown in FIG. 13. Current flows through the third group of cells (shaded grey) via two busbar links (13-1) connected in series to the final group of cells in parallel. FIG. 14 shows the final group of cells (shaded grey) through which current flows out of the module via external connectors (14-1).

In this third example, it can be seen from FIGS. 11-14, that 9 cells act together at the first stage, 8 at the second stage, 7 at the third stage and 8 at the final stage i.e. there are unevenly balanced cells across the module. Hence, it can be seen that for the same arrangement of cells in a module, it is possible, by adjusting the switching configuration, to alter the balance of the output from/load on individual cells groups connected in parallel, within the module.

Figure 15:
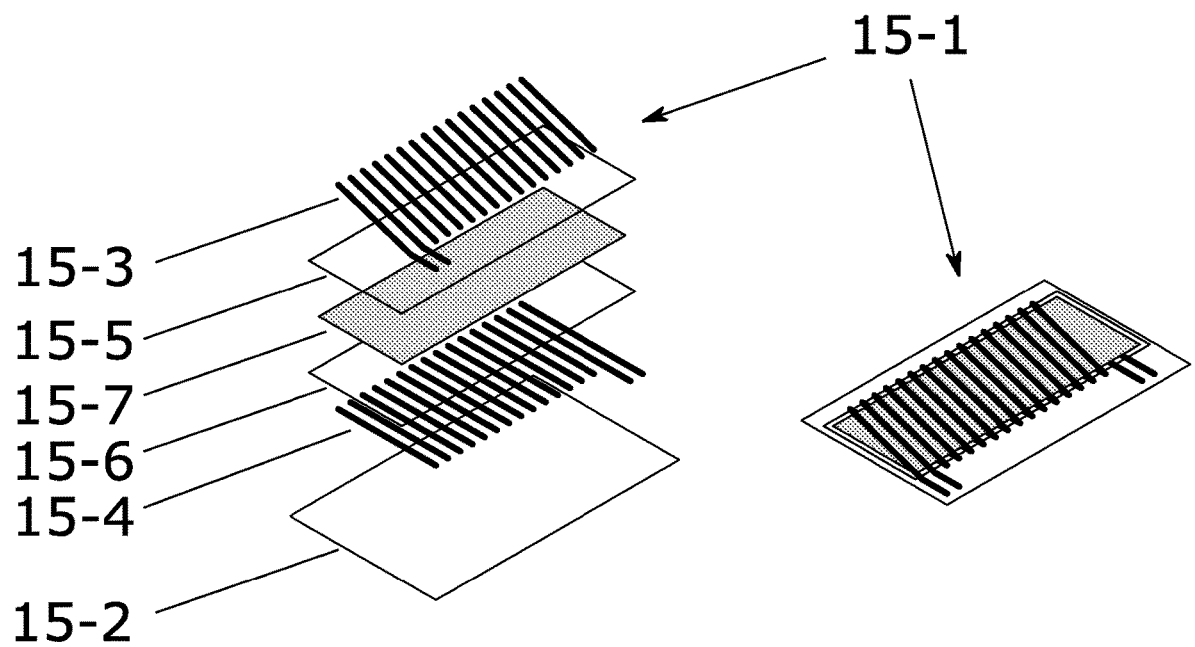
FIG. 15 shows an exploded view of a magnetometer on a substrate.

FIG. 15 shows an example of a fluxgate 15-1 that may be formed by printing on a substrate 15-2. The fluxgate comprises an upper conductive layer 15-3 and a lower conductor layer 15-4, each of the conductive layers comprising conductive wire portions arranged on a surface of a respective insulative layer 15-5, 15-6. The fluxgate further comprises a magnetic core 15-7 sandwiched between the upper and lower conductive layers, wherein ends of the conductive wire portions from the upper conductive layer are joined to ends of the conductive wire portions from the lower conductive layer to form coil structures, and wherein the lower conductive layer of the fluxgate is mounted to a substrate.

Figure 16:
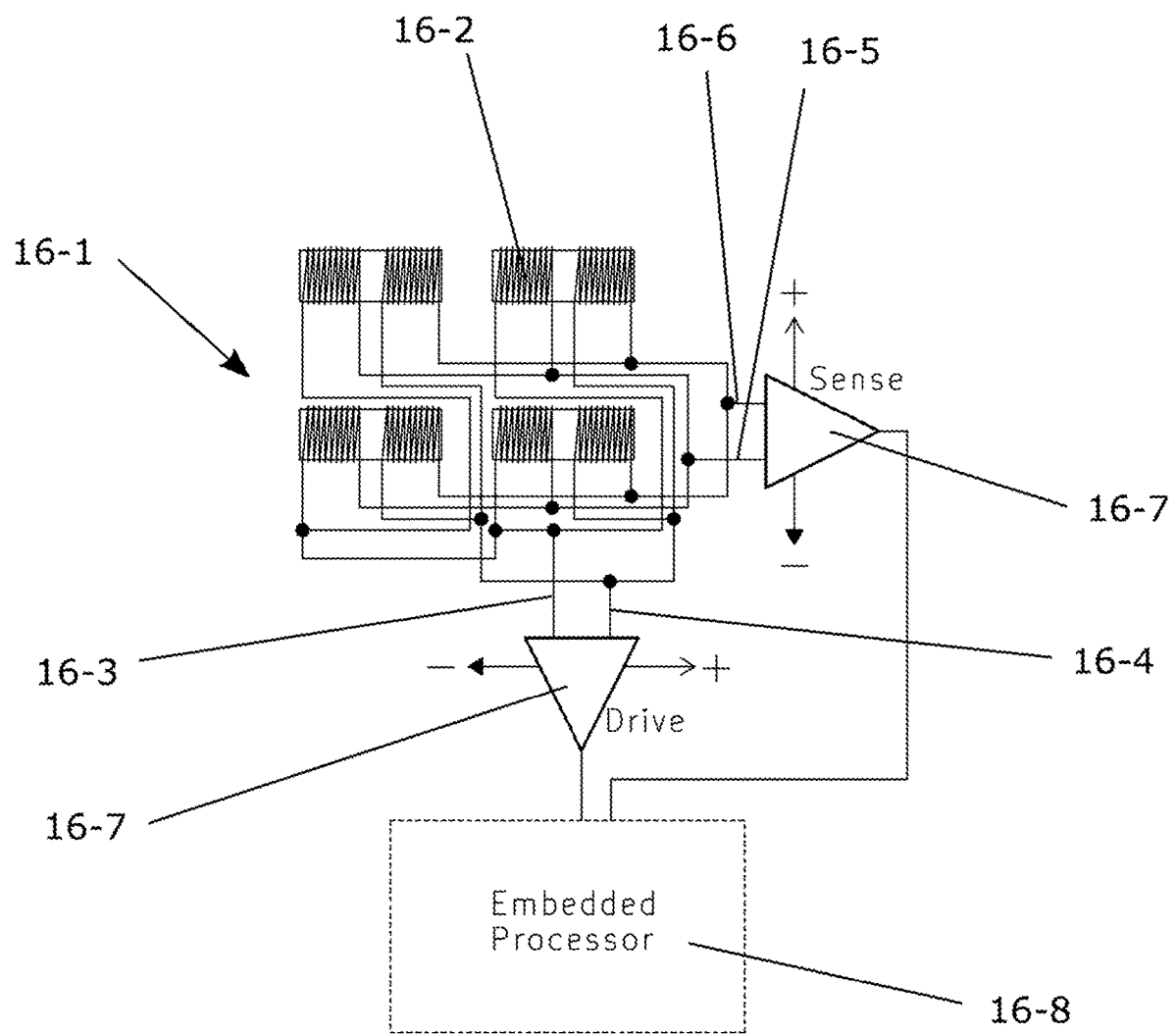
FIG. 16 shows a schematic of a multiplexed array of magnetometers such as that shown in FIG. 15.

FIG. 16 shows an example array 16-1 of multiplexed fluxgates 16-2 similar to that shown in FIG. 15. Drive coil negative 16-3, drive coil positive 16-4, sense coil negative 16-5 and sense coil positive 16-6 connections can also be seen. The multiplexers 16-7 send outputs to a processor 16-8.

Figure 17:
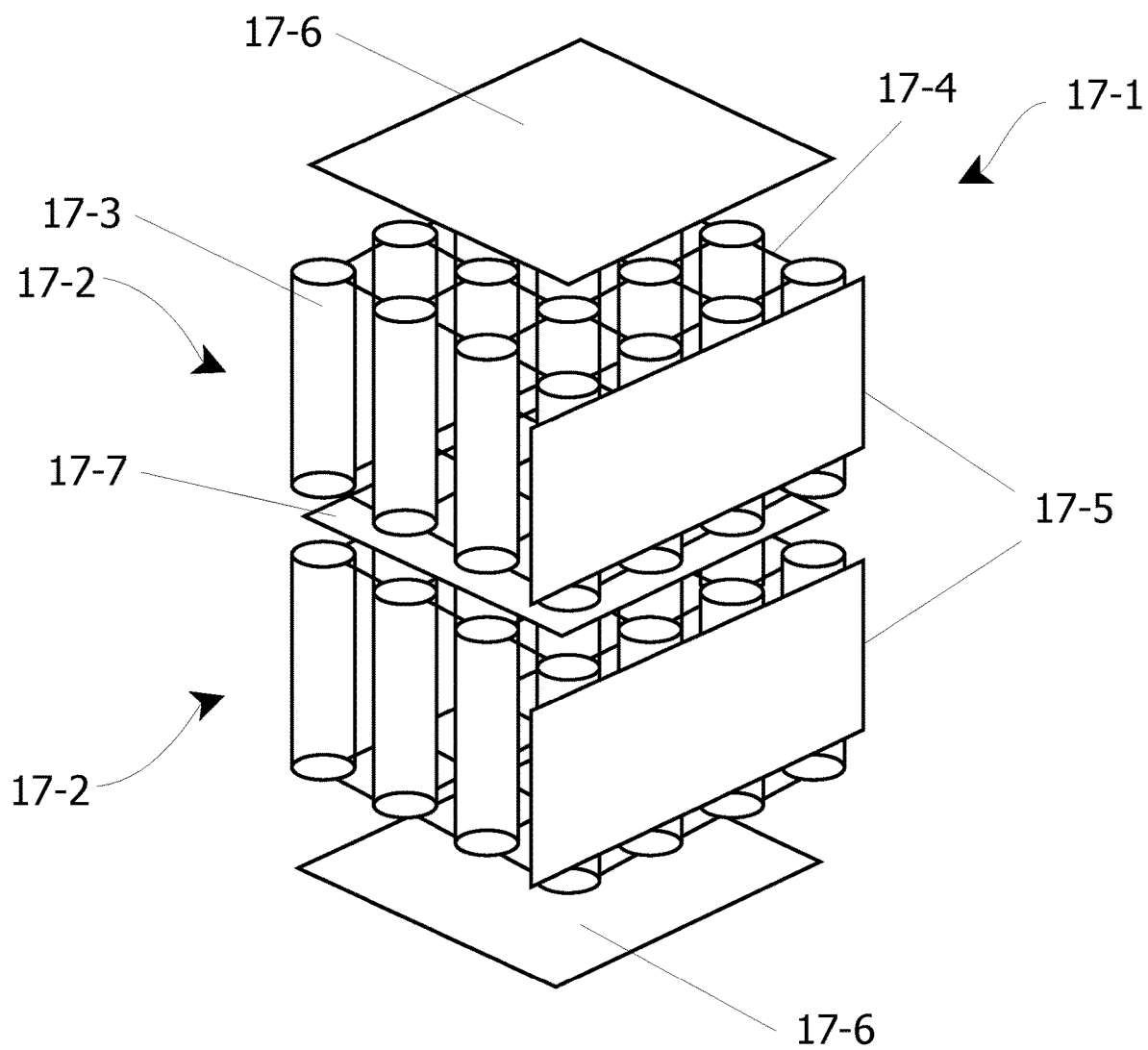
FIG. 17 shows a perspective view of an example battery pack.

FIG. 17 shows an example battery pack 17-1 comprising two battery modules 17-2, each battery module comprising an array of cells 17-3. Busbar configurations 17-4 and battery management systems 17-5 are connected to each battery module. Sensor arrangements 17-6 are fitted to the exterior of the busbar arrangements. A third sensor arrangement 17-7 is also fitted between the battery modules.

Figure 18:
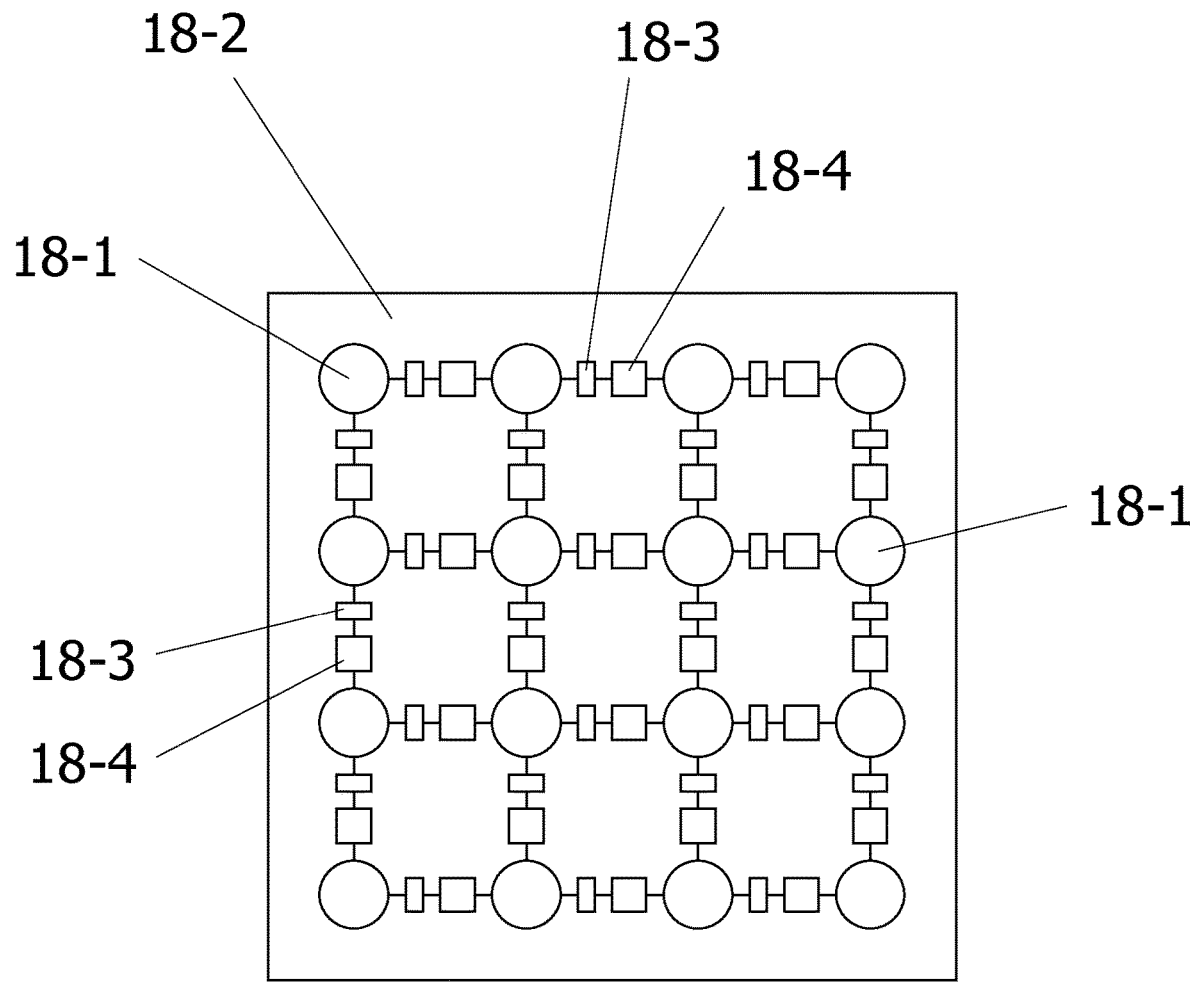
FIG. 18 shows a plan view of a busbar arrangement with integrated sensors.

Commercially available power electronics and current/magnetic field sensors such as those previously described can be directly embedded in a busbar arrangement, as shown in FIG. 18.

FIG. 18 shows a plan view of such a busbar arrangement with current sensors 18-3 in the form of Hall sensors and bidirectional switches 18-4 integrated into the busbar (rather than having separate sensors mounted on a busbar arrangement as described above in relation to FIGS. 2 and 3).

The busbar arrangement of FIG. 18 comprises a PCB 18-2 with electrical connection points 18-1 that correspond to the cell terminals of a 4×4 cell module to which the busbar arrangement can be connected. The cells (not shown) are attached to the underside of the PCB 18-2 using a conductive adhesive. The current sensors 18-3 and bidirectional power switches 18-4 are mounted between each electrical connection point 18-1. The busbar arrangement can be used to replace a conventional busbar arrangement by simply fitting the PCB 18-2 to a cell module via the connection points 18-1.

Figure 19:
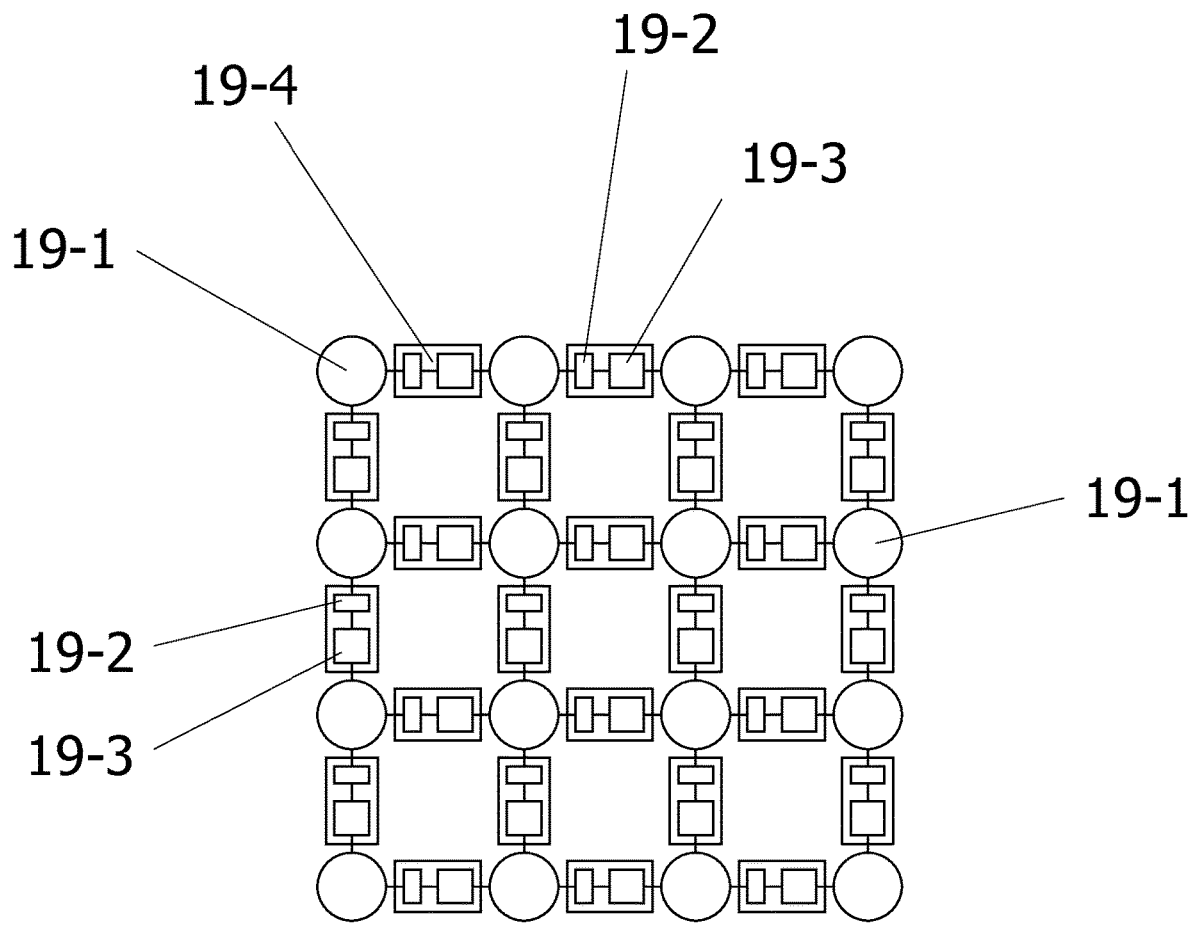
FIG. 19 shows a plan view of another busbar arrangement with integrated sensors.

Alternatively, the cells of a cell module can be connected via integrated busbar links as shown in FIG. 19. Electrical connection points 19-1 correspond to the cell terminals of each cell (16 cell terminals are shown in FIG. 19). Conductive adhesive is used at each connection point 19-1 to connect the cell to the integrated busbar links which comprise a current sensor 19-2 and a bidirectional power switch 19-3, both mounted on a PCB 19-4 and connected in series. Alternatively, a current sensor and bidirectional power switch can be connected to the cell terminals via wires in free space.

The integrated current sensors 18-3, 19-2 in the above described arrangements of FIGS. 18 and 19 are connected in series with the bi-directional power switches 18-4, 19-3.

The bi-directional power switches 18-4, 19-3 are MOSFET configurations in order to produce a low resistance, high power switch.

It will be appreciated that these arrangements can perform any or all of the functions previously described in relation to separate sensor and busbar arrangements, including the monitoring of current flow and the dynamic reconfiguration of a battery pack by adjusting the switching configuration, to alter the balance of the output from/load on individual cells groups connected in parallel within the module. They can also enable degraded cells to be isolated or reconfigured in order to perform continuous cell balancing to maximise the safe usable energy of the battery.

As such, these busbar arrangements with integrated current sensors can provide a simpler, more robust and more compact way of realising the advantages of the present invention.

Any of the sensor arrangements described herein can also be separately be employed to check the quality of cell/busbar connections in a battery pack in order to identify faults in the connections themselves in addition to ensuring that all cells are functioning correctly. This has the potential to identify, non-invasively, a faulty weld in a battery pack.

To achieve this current/magnetic sensors such as the magnetometers or Hall sensors previously described can be placed between each cell to measure the current flow in the busbar link between neighbouring cells. This allows the current flow in individual cells to be determined as previously discussed; if reduced current flow is detected, bad welds can be identified.

The invention claimed is:

1. A sensor arrangement for a network of busbar links of a battery module, the sensor arrangement comprising:
    an array of sensors, each sensor of the array of sensors having an output arranged to provide an indication of current in a respective busbar link of the network of busbar links; and
    a processor coupled to outputs of sensors of the array of sensors and configured to:
        receive data from the outputs of the sensors;
        process the data to determine a current in each busbar link of a set of busbar links that are connected at a node of the network of busbar links; and
        compare currents in busbar links of the set of busbar links to determine an overall current at the node,
    wherein each sensor of the array of sensors comprises a magnetic field sensor for sensing a magnetic field adjacent the busbar link when the magnetic field sensor is fitted to a busbar, the magnetic field being a result of the current through the busbar link, and wherein the data from the outputs of the sensors comprises magnetic field data.

2. The sensor arrangement as claimed in claim 1, wherein the array of sensors comprises any of: Hall probes; magneto-resistive sensors; magneto-electric sensors; optically pumped magnetometers; fluxgates; printed fluxgates; and/or MEMS fluxgates.

3. The sensor arrangement as claimed in claim 1, wherein each magnetic field sensor has a sensitivity greater than 1 μT $Hz^{-1/2}$.

4. The sensor arrangement as claimed in claim 1, wherein each magnetic field sensor comprises a drive coil and a sense coil, outputs from the drive coil and the sense coil are arranged to send coil signal data from the drive coil and the sense coil to inputs of multiplexers, and the multiplexers are arranged to send multiplexer signals to inputs of the processor.

5. The sensor arrangement as claimed in claim 1, wherein the array of sensors is arranged on a substrate for attachment to the busbar, or wherein the array of sensors is arranged to be integrated into a busbar arrangement.

6. The sensor arrangement as claimed in claim 1, wherein the processor is configured to process the data to determine the current in each busbar link of a plurality of sets of busbar links and compare currents in respective busbar links of each set of busbar links to determine overall currents at a plurality of nodes.

7. The sensor arrangement as claimed in claim 6, wherein the processor is configured to determine a condition of each cell of a plurality of cells of the battery module based on electrical current values at the plurality of nodes when the sensor is fitted to the busbar and the battery module such that each of the plurality of cells is electrically connected to a respective node of the network of busbar links.

8. The sensor arrangement as claimed in claim 7, wherein the condition of each cell being determined by the processor is one or more of: a state of health (SoH) of the cell; a state of charge (SoC) of the cell; a presence of one or more defects leaking charge internally between terminals of the cell; a temperature and/or predicted temperature change of the cell; and a determination of overheating of the cell.

9. The sensor arrangement as claimed in claim 1, wherein the sensors of the array of sensors are held in a spaced relationship with respect to each other in the array of sensors and positioned so that each sensor of the array of sensors aligns with a corresponding busbar link of the network of busbar links when the sensor arrangement is fitted to the busbar of the battery module.

10. The sensor arrangement as claimed in claim 1, wherein the processor is configured to determine an amplitude and direction of the current flowing through each of the busbar links, and is configured to determine the overall current at the node of the network of busbar links based on the amplitude and direction of currents.

11. A method of assessing a condition of a weld and/or connection between cells of the battery module using the sensor arrangement as claimed in claim 1, wherein neighbouring cells of the battery module are connected to one another via the busbar links, the method comprising:
processing the data received from the outputs of the sensors to assess the currents in the busbar links between the neighbouring cells;
comparing the currents flowing through individual cells, the nodes and/or the busbar links; and
identifying a faulty weld and/or connection based on detecting a level of current that is indicative of a defect.

12. A busbar configuration for a battery module comprising:
a plurality of busbar links arranged in a network for connection to respective cells of the battery module at a plurality of nodes of the network of busbar links,
an array of sensors, each sensor of the array of sensors having an output arranged to provide an indication of current in a respective busbar link of the network of busbar links; and
a processor coupled to outputs of sensors of the array of sensors and configured to:
receive data from the outputs of the sensors;
process the data to determine a current in each busbar link of a set of busbar links that are connected at a node of the network of busbar links; and
compare currents in busbar links of the set of busbar links to determine an overall current at the node, and
wherein each sensor of the array of sensors comprises a magnetic field sensor for sensing a magnetic field adjacent the busbar link when the magnetic field sensor is fitted to a busbar, the magnetic field being a result of the current through the busbar link, and wherein the data from the outputs of the sensors comprises magnetic field data, and
wherein each sensor of the array of sensors is provided adjacent to each of the plurality of busbar links, each sensor of the array of sensors is provided in series with each of the plurality of busbar links, and/or each sensor of the array of sensors is integrated into each of the plurality of busbar links.

13. The busbar configuration of claim 12, wherein the plurality of busbar links comprises a plurality of switches, wherein each switch of the plurality of switches is associated with a corresponding busbar link to switch on/off a current flow through the corresponding busbar link.

14. The busbar configuration of claim 13, wherein switches of the plurality of switches are bi-directional switches.

15. The busbar configuration of claim 13, wherein between each of the plurality of nodes of the network, one of the plurality of switches is connected in series with one of the sensors of the array of sensors.

16. The busbar configuration of claim 15, wherein some or all connections between the plurality of nodes of the network, the plurality of switches and/or the array of sensors are formed using conductive adhesive, conductive film, or pressure connectors.

17. The busbar configuration of claim 13, wherein operation of the plurality of switches can be coordinated to isolate a cell within the battery module.

18. The busbar configuration of claim 13, wherein operation of the plurality of switches can be coordinated to connect groups of cells in series and/or parallel within the battery module.

19. A method of optimising an output from or load on cells of the battery module, the battery module comprising the busbar configuration as claimed in claim 13, the method comprising:
operating the plurality of switches of the busbar configuration to isolate one or more cells, connect groups of cells in series, and/or connect the groups of cells in parallel within the battery module.

20. A battery module comprising:
an array of cells, the cells being electrically connected by a busbar configuration that comprises:
a plurality of busbar links arranged in a network for connection to respective cells of the battery module at a plurality of nodes of the network of busbar links,
an array of sensors, each sensor of the array of sensors having an output arranged to provide an indication of current in a respective busbar link of the network of busbar links; and
a processor coupled to outputs of sensors of the array of sensors and configured to:
receive data from the outputs of the sensors;
process the data to determine a current in each busbar link of a set of busbar links that are connected at a node of the network of busbar links; and
compare currents in busbar links of the set of busbar links to determine an overall current at the node, and
wherein each sensor of the array of sensors comprises a magnetic field sensor for sensing a magnetic field adjacent the busbar link when the magnetic field sensor is fitted to a busbar, the magnetic field being a result of the current through the busbar link, and wherein the data from the outputs of the sensors comprises magnetic field data,
wherein each sensor of the array of sensors is provided adjacent to each of the plurality of busbar links, each sensor of the array of sensors is provided in series with each of the plurality of busbar links, and/or each sensor of the array of sensors is integrated into each of the plurality of busbar links, wherein the network of busbar links extends between adjacent cells, wherein a sensor of the array of sensors is mounted on each busbar link between the adjacent cells, the sensor is provided in series with each of the busbar links and/or the sensor is integrated into each of the busbar links, and wherein the processor is configured to monitor electrical current flowing in each cell.

21. The battery module of claim 20, wherein each node of the plurality of nodes is connected to a cell of the battery module.

22. The battery module of claim 21, wherein each node of the plurality of nodes is connected to a respective cell of the array of cells via a conductive adhesive, a conductive film, or pressure connectors.

23. The battery module of claim 20, wherein the array of cells are lithium-ion cells.

24. The battery module as claimed in claim 20, wherein the array of cells of the battery module comprises an array of 6 by 4 cells.

25. A battery pack comprising one or more battery modules as claimed in claim 20, wherein the one or more battery modules are electrically coupled to form the battery pack, and the battery pack comprises one or more battery management systems for controlling an output from a set of terminals of the battery pack.

26. The battery pack as claimed in claim 25, wherein the battery pack is arranged to send a dataset to the one or more battery management systems, and the one or more battery management systems control a plurality of switches based on the dataset, wherein each switch of the plurality of switches is associated with a corresponding busbar link to switch on/off a current flow through the corresponding busbar link, and wherein the dataset comprises any one or a combination of:
  the data from the outputs of the sensors;
  current in each of the set of busbar links that are connected at the node of the network;
  the overall current at each node;
  a condition of each of a plurality of cells; and/or
  an optimum voltage and/or current from the battery pack.

* * * * *